United States Patent [19]
Ferri et al.

[11] Patent Number: 5,935,502
[45] Date of Patent: Aug. 10, 1999

[54] METHOD FOR MANUFACTURING PLASTIC PACKAGE FOR ELECTRONIC DEVICE HAVING A FULLY INSULATED DISSIPATOR

[75] Inventors: Stefano Ferri; Roberto Rossi, both of Milan, Italy

[73] Assignee: SGS-Thomson Microelectronics, Agrate Brianza, Italy

[21] Appl. No.: 08/883,850

[22] Filed: Jun. 27, 1997

[30] Foreign Application Priority Data

Jun. 28, 1996 [EP] European Pat. Off. ............ 96830372

[51] Int. Cl.⁶ .......................... B29C 33/12; B29C 45/02; B29C 70/70
[52] U.S. Cl. .............................. 264/272.15; 264/272.17; 264/275; 264/278
[58] Field of Search ................... 264/272.15, 272.17, 264/275, 276, 277, 278; 425/116, 121, 123, 544, 125

[56] References Cited

U.S. PATENT DOCUMENTS

| | | | |
|---|---|---|---|
| 3,593,411 | 7/1971 | Dunn | 29/588 |
| 4,467,522 | 8/1984 | Marchisi | 264/272.17 |
| 5,044,912 | 9/1991 | Billings et al. | 425/116 |
| 5,427,938 | 6/1995 | Matsumura et al. | 437/217 |
| 5,444,025 | 8/1995 | Sono et al. | 437/207 |
| 5,661,342 | 8/1997 | Kawamoto | 257/712 |
| 5,744,084 | 4/1998 | Chia et al. | 264/276 |
| 5,766,985 | 6/1998 | Mangiagli et al. | 438/121 |

FOREIGN PATENT DOCUMENTS

| | | |
|---|---|---|
| 0 472 199 | 2/1992 | European Pat. Off. . |
| 0 497 744 | 8/1992 | European Pat. Off. . |
| 0 545 487 | 6/1993 | European Pat. Off. . |
| 3036753 | 2/1991 | Japan . |
| 5243298 | 9/1993 | Japan . |

Primary Examiner—Angela Ortiz
Attorney, Agent, or Firm—Jenkens & Gilchrist P.C.

[57] ABSTRACT

A method for forming a package of plastic material for a semiconductor electronic device having heat sink fully embedded within the package plastic case, is of the type which provides for forming the plastic case within a mold on whose interior a heat sink has been placed which has a first major surface to be insulated by means of a plastic material layer with a first thickness, whereon a metal leadframe and at least one semiconductor material die having an electronic circuit formed thereon have been fixed, and a second major surface opposite from the first and to be insulated by means of a plastic material layer with a second thickness, thinner than said first thickness; and at least one supporting element adapted to be positioned inside the mold cavity facilitating properly spacing the second surface of the heat sink out from a facing wall of the mold cavity during the process of introducing the plastic material for molding. The heat sink is supported only from the side of the second surface by said at least one supporting element being attached to said wall of the cavity and held within the mold cavity during the injection of plastic material and until the latter becomes fully solidified; each of the supporting elements is provided with a tip having a sharp top of negligible cross-sectional area compared to the tip base; during the molding process, each of the tips is inserted into a portion of a corresponding trench formed in the second surface of the heat sink such that is left unencumbered in said trench portion a peripheral region around said tip to let a flow of plastic material run past during the molding process.

23 Claims, 6 Drawing Sheets

METHOD FOR MANUFACTURING PLASTIC PACKAGE FOR ELECTRONIC DEVICE HAVING A FULLY INSULATED DISSIPATOR

FIELD OF THE INVENTION

The present invention relates to a method for forming a plastic package for an electronic device having a fully insulated heat sink. The method is of the type which provides for forming the plastic case within a mold on whose interior a heat sink has been placed which has a first major surface to be insulated by means of a plastic material layer with a first thickness, whereon a metal leadframe and at least one semiconductor material die having an electronic circuit formed thereon have been fixed, and a second major surface opposite from the first and to be insulated by means of a plastic material layer with a second thickness, thinner than said first thickness; and at least one supporting element adapted to be positioned inside the mold cavity facilitating properly spacing the second surface of the heat sink out from a facing wall of the mold cavity during the process of introducing the plastic material for molding.

BACKGROUND ART

As is well known, electronic semiconductor devices are encapsulated within a package serving as a protection therefor. In particular, reference will be made herein to packages which comprise a plastic material case.

The active portion of such devices is a plate or "die" of a semiconductor material which measures a few square millimeters in surface area and has an electronic circuit, usually an integrated circuit, formed thereon.

So-called power packages are used for those devices which are liable to develop heat in relatively large amounts, as may be due either to high density or large numbers of power components therein, or to operation with large currents, that to is for electronic power devices. For this reason, a heat sink is included in the package to dissipate heat generated within the package. The heat sink should have special constructional, e.g. a large heat dissipation area, and thermal features, e.g. high thermal conductivity. In practice, it is an element made of a metal, or good heat conductor, whose mass is definitely larger than that of the die to which it is coupled thermally.

To convey a heat flow generated during the device operation toward the ambient air, the heat sink is only partly embedded within the plastic case, with a major surface of the heat sink being left exposed, i.e. uncovered by the plastic material. An external heat sink may optionally be arranged to contact this exposed surface in order to further enhance the transfer of heat to the package outside.

In certain applications where the device is to operate at a high voltage, e.g. audio apparatus such as car radio sets, high-fidelity devices, and stereo systems for household use, the heat sink is sometimes further connected to the metal framework of the apparatus as well, such as a radio own chassis, to produce a conveniently expanded dissipating surface. However, this arrangement may affect the operation of the integrated circuit in an adverse manner. In fact, the chassis of the apparatus would normally be grounded or at a predetermined electric potential.

Alternatively, the heat sink may be connected to a printed circuit board, or to an external heat sink of larger size, again for the purpose of enhancing the transfer of heat.

In all of the above cases, the voltage between the dissipating outer metal structure, the heat sink proper and the semiconductor material die may damage the power device irreparably.

In general, if discharge between the heat sink and the printed circuit board or the metal pins of the package is to be prevented, the heat sink must be insulated electrically from the metal structures in contact therewith, or from the external heat sink.

Certain prior arrangements for insulating the device electrically, such as the interposition of insulating materials (e.g. mica) between the exposed surface of the internal heat sink and the outside structure providing additional dissipation, result in added complication and cost for their assembly and testing.

Other solutions consist of forming an insulating layer over the exposed surface of the heat sink. Such processes provide, for example, for the deposition of an oxidizing metal layer, followed by an oxidation or by the deposition of an insulating layer by a chemical method. Drawbacks are encountered in carrying out such processes, especially when chemical treatments are used.

The present invention is related in particular to the methods most commonly used for insulation wherein the exposed surface of the heat sink is fully covered with the same plastic material as the package case. The heat sink obtained with these methods is fully embedded within the plastic case during the case molding step. The resultant package is referred to as having an insulated heat sink, it being understood that the insulation provided is electrical in nature.

To best compromise, satisfactorily and functionally, between a good electric insulation and optimum dissipation of the device heat, it is necessary for the layer of plastic material covering said surface of the heat sink to be quite thin.

Referring to FIG. 1, it is shown diagramatically a side view of a typical insulated heat sink power package, with its left-hand portion in section, such as it appears after the molding step. The package is generally and schematically shown at 1.

In this and the following figures, has been considered illustratively the instance of a so-called "single-in-line" package wherein the pins protrude out of only one long side of the package body. This configuration is a frequently adopted one for power packages.

The package 1 for the electronic device comprises suitable supporting and electric interconnection means within a case 2 made of a plastic material, typically a resin. A die of a semiconductor material, on which the device has been formed, is mounted rigidly with such means so as to leave the surface where the circuit is formed unencumbered.

Specifically, for mounting the package to a printed circuit board, a lead leadframe 3 typically comprises, as shown by the cross-sectional portion, a plurality of electric connectors or leads, denoted by 4, which have one end outside the case 2. The leads 4, once bent, will form the package pins.

The structure for supporting the die also functions to dissipate heat generated within the package and includes, for this purpose, a heat sink 5.

The leadframe 3 is connected to the underlying heat sink 5, usually by means of rivets, not shown in the figure. The leadframe 3 is held by the rivets slightly raised above the heat sink 5, and their electric connection is only effected through suitable sunk areas of the leadframe, in this example.

The semiconductor material die, not shown in the figure, is fixed on the top surface of the heat sink 5. For connecting the leadframe 3 electrically to the circuit, the inner ends of the leads are connected by thin metal wires to a corresponding metallized area provided on the exposed surface of the die.

The assembly formed of the leadframe 3 and the heat sink 5 is duplicated for a number of times forming a continuous strip. A peripheral structure of a single leadframe is part of a common holder structure of the whole strip. As shown in the Figure, directly after molding, the peripheral structure, denoted by 6, will remain outside the case 6 while still joining the packages together in one strip.

As can be seen, the plastic case 2 encapsulates the leadframe 3 partially to leave only the ends of the leads 4 on the package outside, and fully encapsulates the heat sink 5.

The bottom surface of the heat sink 5 is covered, in fact, by a resin layer 7. This layer is provided quite thin, so that its thermal resistance can be kept low. In this situation, the transfer of heat from the heat sink to the ambient occurs unhindered. The term "thin" used herein in connection with the thickness of the layer 7 will indicate a negligible thickness compared to that of the plastic material covering the heat sink surface on the side of the die, i.e. at the top in the figure.

Shown in FIG. 2 for the sake of clarity is a top plan view of the package 1 of which FIG. 1 shows a partial cross-section taken along a section poly line A—A. Shown therein are the package for a single device and a portion of the leadframe of an adjacent device.

The leadframe 3 and heat sink 5 are shown in phantom lines in so far as concerning their portions included within the case 2.

The rivets connecting the leadframe 3 to the heat sink 5 are shown at 8. An electric connection between the leadframe 3 and the heat sink 5 is established, in accordance with an exemplary solution described in European Patent Application 545007 by the Applicant, by a conductive leadframe lead 9 which is sunk in the central portion to contact the heat sink 5.

Defined in the leadframe 3 are the metal leads 4, still joined together by transverse interconnecting sections extending from a central region of the leadframe toward the bottom peripheral holder structure 6 with which they are formed integrally.

For a better understanding of the present invention, a brief review of the standard process steps for forming conventional packages may be of assistance in conjunction with the previous figures. Once the leadframe 3 is constrained to the heat sink 5, the corresponding dice are mounted conventionally by placing them directly onto a major surface of the heat sink 5, without the leadframe 3 interposed.

The die is positioned centrally on the heat sink 5, spaced apart from the leads 4. Alternatively, in a modified embodiment, the die is placed onto a central portion of the leadframe 3 which is also connected to the heat sink 5. In the former case, the die is fixed as by soldering, using a low-melting alloy such as a lead/tin alloy, or gluing, using a suitable glue such as an epoxy adhesive.

The ends of the leads 4 which surround the die and are isolated therefrom are then connected electrically using thin metal wire leads, usually gold wire.

The strip, with the dice assembled thereto, is then placed into a mold having corresponding cavities for the individual devices, for injecting an electrically insulating material in a molten state at a high temperature to form the plastic body of the package. This material is typically a synthetic resin, e.g. an epoxy resin. The transfer molding process is carried out in steps through which the temperature is varied gradually to avoid cracking the semiconductor material or in any way impairing the device reliability. After a first cooling step, and subsequent curing steps to promote thorough polymerization of the resin, the series of packages thus formed are removed from the mold.

FIG. 3 illustrates schematically the molding process for the formation of the package shown in the previous figures. In particular, the figure shows a single cavity mold.

A mold for the injection of resin is generally shown at 10. It comprises an upper half or top mold 10a and a lower half or bottom mold 10b, each provided with a corresponding recess. The two halves are disposed with their recesses opposite to each other so as to form a mold cavity into which the resin will be introduced.

The leadframe 3 (labeled in FIGS. 1 and 2) is placed between the two halves 10a and 10b, inside the mold cavity with the ends of the leads 4 (labeled in FIGS. 1 and 2) protruding outside. Also shown in the figure, on the opposite side from the leads 4, is a section of part of the peripheral holder structure 6 of the leadframe 3 which is left outside the mold cavity.

The rivets 8 providing mechanical connection are clearly visible in the figure along with the die 11 located on the top surface of the heat sink 5.

The molten resin is injected through a gate provided in the mold, as shown at 12 in FIG. 3. It can be seen that the ID gate 12 has its axis substantially horizontal, at the level of the heat sink, and has an opening into the mold cavity which locates in one of the side surfaces, as shown at 13. This location of the gate 12 allows the mold cavity to be filled gradually to its farthest region from the resin entrance, on the right in the figure. In particular, to foster an even inflow of resin, it has been found convenient to have the gate 12 located close to one mold corner, or edge of the package to be formed.

To form the thin layer 7 shown in FIG. 1, it is common practice to create a gap, during the case 2 molding, between the bottom surface of the heat sink and the facing wall of the mold cavity, such as by reducing the heat sink thickness, for example. This gap will be filled with the resin. In other words, the surface 14 of the heat sink and the facing wall 15 of the mold cavity are spaced apart to provide room for the formation of an insulating layer.

Typically, the surface 14 of the heat sink, which is to be covered with the thin insulating layer, is so disposed within the mold as to be the bottom surface. In this way, the resin flow to the region, referenced 16, constituting a slit between the surface 14 and the wall 15, is facilitated.

However, due to the small thickness of the filling region 16 underlying the heat sink 5, it is extremely difficult to fully cover, or cover with plastic material to an even thickness, the bottom surface 14 by such a conventional molding arrangement, even in the preferential embodiment thereof.

To illustrate this drawback, indicated by arrows in FIG. 3 is the main direction of the streamlines for the resin entering the mold cavity. The molten plastic material from the gate 12 is distributed out both toward the upper portion of the cavity, overlying the support and dissipation structure 3 and 5, and toward the lower portion underlying the heat sink 5. However, it will meet a higher flow resistance toward the lower portion of the mold than toward the upper portion thereof. In fact, the downwardly directed passage channel where the resin flow has to be introduced has a significantly smaller cross sectional area.

A flawless homogeneous layer is difficult to obtain, especially where high-dissipation resins are used which contain coarse crystalline fillers. And yet, not even by using a low-viscosity resin can the problem be solved to the point that a uniform thickness can be ensured in a repeatable manner for the resin layer 7 which is to insulate the heat sink.

Even when the resin fully covers the bottom surface 14 of the heat sink 5, the resulting electric insulation is bound to be doubtful and the heat dissipating capability to be degraded. Moreover, the thickness of the plastic material layer under the heat sink 5 cannot be increased since it is necessary that it exhibit low thermal resistance.

To overcome the high resistance to the resin flow and ensure a low rate of defectivity in the resin, the resin is usually injected under a high pressure.

However, just due to the fact that the resin enters the mold cavity under pressure and that, moreover, the amount of resin is greater in the portion above the heat sink, the heat sink, through not being held firmly within the mold, is pushed downwards. This further restricts the resin channel 16, and may on occasions cause the bottom surface 14 of the heat sink to touch the opposite wall 15 of the mold cavity.

The problem is worsened in that the heat sink may undergo deformations during the forming and leadframe mounting steps, so that the heat sink may enter the mold in a slightly concave shape, with its central portion sunk down. In this condition, the central region of the bottom surface 14 of the heat sink is particularly likely to be left uncovered due to downward displacement of the heat sink during the molding process.

This poses the problem of an accurate and well calibrated positioning of the heat sink in the mold during the resin injection and gardening.

In order to ensure a satisfactory level of quality and reliability of the electric insulation, some solutions are known which provide for the use of pairs of clamping pins in engagement with the heat sink and the leadframe, from below as well as from above, to retain the heat sink in the corrected position inside the mold cavity during the molding process.

Such solutions have been applied, for instance, to devices wherein one of the leads is formed integrally with the heat sink, thereby also functioning as a device electrode or terminal. In this case, only the leads are clamped between the two mold halves and, accordingly, keep the structure fixed from one side. On the opposed side, the heat sink is instead completely allowed to move within the cavity during the molding process. In any case, the problems are similar to those discussed in connection with the exemplary structure of FIGS. 1–3.

A first known method employing clamping pins provides for the use of pin pairs fixed inside the mold cavity to block the heat sink and leadframe during the resin injection and until the resin hardens. In this way, the heat sink remains immovable during the molding process. However, when the package is removed from the mold, the volumes occupied by the pins are found uncovered by the resin, and in particular portions of the heat sink bottom surface are left exposed. It becomes necessary to fill these volumes with additional liquid thermosetting resin to thoroughly seal the package and avoid the risk that the device may lack insulation in such regions. Otherwise, the international standards concerning insulation and safety would not be met. In addition, the device mounted on the printed circuit board may be destroyed by incidental short circuits with other devices.

Packages made with the above method exhibit reliability and cost problems. In fact, the reliability of the electric insulation of devices thus encapsulated is heavily dependent on the adhesion characteristics at the interface between the liquid sealing resin and the encapsulating resin. The cost of a device sealed with two resins is increased by the addition of a manufacturing step, necessary for dispensing the liquid sealing resin. Furthermore, disadvantages due to the difficulty involved in the control of such dispensation by automated processes, and to the criticalness of the resin dosing should be considered, since any excess of liquid sealing resin which may leak out onto the surface intended to be superimposed to the external dissipation structure would impair the surface planarity and, hence, the proper transfer of heat.

An improved method is described in U.S. Pat. No. 4,888,307 owned by the same assignee as this patent. This known method provides for the insertion, prior to molding, of thermoplastic nails through suitable holes formed in the heat sink, as shown in FIGS. 4a and 4b. In FIG. 4a, the heat sink 5' is shown schematically in a section across the holes, and the nails are designated 17. The upper ends of the nails are riveted, and then the heat sink is placed into the mold 10' as shown in FIG. 4b. During the molding process, the heat sink is clamped by pairs of fixed pins 18.

On removal of the finished package from the mold, both major surfaces of the heat sink remain insulated by plastic material by virtue of the nails 17 provided, thereby avoiding the need for forming additional resin plugs. However, the process complexity is not reduced because additional processing steps are required prior to molding.

A further solution to the problem is described in the aforementioned U.S. patent, and depicted in FIGS. 5a–5c. The proper positioning of the heat sink within the mold cavity is ensured by pairs of retractable locating pins 19. The method comprises the steps of inserting the heat sink 5" and leadframe 3" into the mold cavity, between the mold halves 10"a and 10"b, and blocking them by the pins 19, as shown in FIG. 5a. Thereafter, a first resin injection step is carried out through the gate 12". Once the mold cavity is filled with the resin, the pins 19 are pulled gradually out of the mold while carrying out a second resin injection step to fill the voids left by the pins, as shown in FIG. 5b. The retraction of the pins 19 is effected concurrently with the resin polymerising and hardening. FIG. 5c shows that, after completion of the molding process, the finished package is ejected out of the mold by driving the locating pins 19 and specially provided ejecting pins 20.

In actual practice, during the first step, the resin would have a low viscosity at a predetermined molding temperature, which facilitates its flowing. During this step, the proper positioning of the heat sink 5" is ensured by the pins. During the second step, the cavity fully filled with resin slows the movement of the heat sink 5", which is now supported by the resin having increased viscosity during this step. As can be seen, the formation of the plastic case by this method is completed with the molding process, and requires no additional operations. Furthermore, the use of a single plastic material for the package allows the formation of a case which can better seal the device.

A disadvantage of this method resides, however, in the high cost of the precision mechanism used to drive the pins during the molding process, in the respect of the assembly, testing, and maintenance thereof.

In addition, the reliability of this method rates fairly low because it is impossible to completely and predictably prevent the heat sink from shifting downwards upon retraction of the pins from the mold. Thus, the proportion of packages where, upon complete resin solidification, part of the heat sink bottom surface is left uncovered is quite significant.

It should also be considered that there is a substantial risk of defects developing in the resin at the regions previously occupied by the locating pins. In fact, the encapsulation process provides, as said before, for the resin injection to be carried on at increased viscosity during the second step in order to fill the voids left by the pins. Due to the increased resin viscosity, the resin compacting may turn out unsatisfactory (reduced thickness, porosity, etc.), which results in faulty electric insulation at the locations of the retracting locating pins.

The underlying technical problem of this invention is to provide a method of forming an electronic device package of plastic having an insulated heat sink, whereby optimum position stability can be ensured for the heat sink until the plastic material is fully solidified. The method should also be uniquely simple, requiring no additional steps to molding, to yield a reliable package as concerns electric insulation and thermal dissipation.

Another object is to enable the use, in the molding process, of a simple and versatile apparatus which can be readily implemented and involves very low maintenance costs.

SUMMARY OF THE INVENTION

A method for forming a plastic package for a semiconductor electronic device having a heat sink fully embedded in the plastic case of the package provides for forming the plastic case within a mold having a heat sink positioned therein. The heat sink has a first major surface to be insulated by means of a layer of plastic material having a first thickness, which surface has a metal leadframe and at least one die of a semiconductor material fixed thereon, on which an electronic circuit has been formed. A second major surface opposite from the first is to be insulated by means of a layer of plastic material having a second thickness, thinner than said first thickness. At least one supporting element adapted to be placed inside the mold cavity affords proper spacing of the second heat sink surface out from a facing wall of the mold cavity during the process of introducing the plastic material for molding.

The underlying technical problem of this invention is solved by a method of forming a package of plastic having a heat sink fully embedded in the plastic case, as indicated above and defined in the claims.

In conformity with the invention, one or more supporting elements only bear the heat sink from the side of its second surface. The supporting elements are fixed: they are mounted to the mold cavity wall facing the second surface of the heat sink, and are maintained within the mold cavity during the introduction of the plastic material and until this fully solidifies. According to the invention, each supporting element has a tip with a sharp top of negligible cross-sectional area compared to the tip base. In addition, each tip is inserted, during the molding process, inside a portion of a corresponding trench formed in the second surface of the heat sink so as to leave, in said portion of the trench, an unencumbered peripheral area around the tip configured as to be effective to let the plastic material flow past during the molding process.

To have the second major surface of the heat sink on which the thin layer of plastic material is to be formed properly spaced from the facing wall of the mold cavity, supporting elements are used which stay within the mold until the plastic material solidifies.

Thus, according to the invention, the advantages of having fixed elements during the molding process are retained. These elements prevent any downward displacement of the heat sink and the leadframe, thereby affording optimum stability for the structure inside the case. This provides control of the thickness of the thin layer being formed and repeatability of the method. It should be noted, moreover, that the absence of mechanisms for driving the supporting elements and the unique simplicity of the apparatus also afford a drastic reduction in costs even as concerns maintenance of the molding device. Also, a consequent advantage is secured of having an improved resin molding.

In addition, to provide the aforementioned function of preventing the heat sink from displacing vertically, according to this invention and unlike conventional processes, no clamping elements are required to engage the top surface, since the supporting elements provided only in the lower portion of the mold provide adequate support by themselves. They allow the aforementioned spacing by resisting any downward displacement of the heat sink. This improves reliability.

In addition to the advantages of having a fixed means of holding the heat sink in position, the present invention eliminates the need for additional processing steps, before or after molding.

For this purpose, the supporting elements in this invention should have a tip with a top very sharp, substantially dimensionless or negligible in size, or significantly smaller than the tip base. During the molding process, only the sharp tip top will be contacting the bottom surface of the heat sink.

Secondly, the surface of the heat sink that is to be covered with the thinner resin layer and that, during the molding process, will typically be the bottom surface, is formed with trenches. These trenches should be sufficiently wide, and be a suitable size and shape to accommodate the supporting elements and to allow a flow of resin around the supporting elements. As a consequence, the side surface around the tip will be covered with the plastic material, but for the tip top in contact with the heat sink surface.

By providing the bottom surface of the heat sink with suitably deep trenches of sufficient width to accommodate the supporting elements, and by having the tips of the supporting elements formed with tops of uniquely small size, the heat sink can be supported securely throughout the molding process, without damage or drawbacks.

The appropriate design of the tips and the trenches allows the exposed metal area of the heat sink bottom surface to be limited to the extremely minute regions occupied by the tip tops.

Notice that, to avoid the risk of short circuits occurring between these tiny exposed areas and external devices, it is expedient that said trenches formed in the heat sink surface be of adequate depth. Specifically, this depth should be such that, once the plastic case is formed, the depth of the exposed areas comparing to the bottom surface of the package can provide the degree of insulation required by a particular application.

As will be described in connection with an embodiment of the invention, this can be readily achieved with conventional heat sinks. Illustratively, the trench depth, at least at the portion where the tip of the supporting element is accommodated, should be of the same magnitude as the tip height.

Preferably in this invention, at least one of the trenches has a first inlet opening on a side surface of the heat sink in order to foster the flow of the molten plastic material around the tips of the supporting elements and, therefore, the trench filling. Preferably, this inlet is formed on that side surface which, during the molding process, is facing the mold cavity surface where a gate is provided for entering of the molten material. In particular, the inlet would be formed substantially correspondingly to the gate location.

In addition, and for example where the width of the trench inlet is at most of the same magnitude as the width of the gate, the supporting elements should not be disposed along the main inflow axis of the resin, that is essentially the gate axis, not to interfere with the stream of plastic material.

For a heat sink having major surfaces substantially rectangular in shape, the formation of an additional trench with one or more respective supporting elements, located symmetrically with the first compared to a central symmetry axis is preferred. This optimizes the stability of the structure on the cavity interior.

The trenches have an additional opening on a side surface, preferably the opposite surface, for an easy resin outflow. Also, the trenches extend along a substantially straight axis, parallel with the resin flow direction.

In its simplest and most advantageous form, the trench shape is substantially that of a parallelepipedon with constant width and depth.

The underlying technical problem of this invention is also solved by a heat sink for an electronic device, adapted to be fully embedded within a plastic package, as indicated above and defined in the claims.

A heat sink for a semiconductor electronic device, adapted to be fully embedded within a case of molded plastic material, has a first major surface to be insulated by means of a layer of plastic material having a first thickness and whereon a metal leadframe for electrical interconnection and a die of a semiconductor material with an electronic circuit formed thereon are fixed, and a second major surface opposite from the first to be insulated by means of a layer of plastic material having a second thickness, thinner than said first thickness.

According to this invention, the second surface of the heat sink is formed with at least one trench with at least one portion having such depth and size as to accommodate the tip of a supporting element providing support for the heat sink during the molding process and to leave unencumbered in that portion of the trench a peripheral area around the tip.

Preferably, the trenches have a pair of openings, an inlet and an outlet on opposite side surfaces thereof, and constant depth. In addition, for heat sinks of commonly used shape, two symmetrically arranged trenches confer improved stability to the heat sink during the process of molding the plastic case in which it is fully embedded.

According to the invention, a semiconductor electronic device package, of the type having an insulated internal heat sink and a molded case of a plastic material, includes:

a heat sink fully embedded within the case and having a first major surface on which at least one die of semiconductor material formed with an electronic circuit is fixed and being insulated by means of a layer of plastic material with a first thickness, and a second major surface opposite from the first which is insulated by means of a layer of plastic material having a second thickness, thinner than the first thickness; and a metal leadframe mounted on the heat sink on the side of the first major surface and including leads, for electric connection to the electronic device, which extend toward the case outside.

In accordance with the invention principles, the heat sink is constructed as described above, and connected with said portion of the trench, the case surface next and parallel to the second surface of the heat sink has a hollow with a first mouth area at the case surface, smaller than that of the corresponding portion of the trench in the heat sink and in depth reaching the second surface of the heat sink to contact a deep wall of the trench whereon it only leaves a second area thereof uncovered which is of negligible size compared to the first area.

The features and advantages of the method according to this invention will be apparent from the following description of an embodiment thereof, given by way of non-limiting example with reference to the accompanying drawings.

DETAILED DESCRIPTION OF A PREFERRED EMBODIMENT OF THE INVENTION

Figure 1:
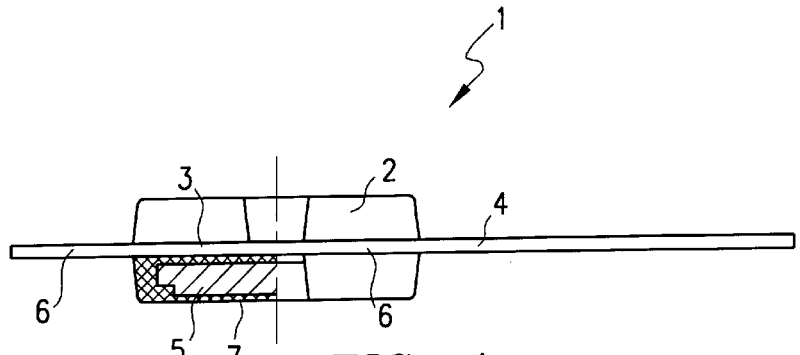
FIG. 1 is a schematic side view partially sectioned showing a plastic package with a conventional type of insulated heat sink.
Figure 2:
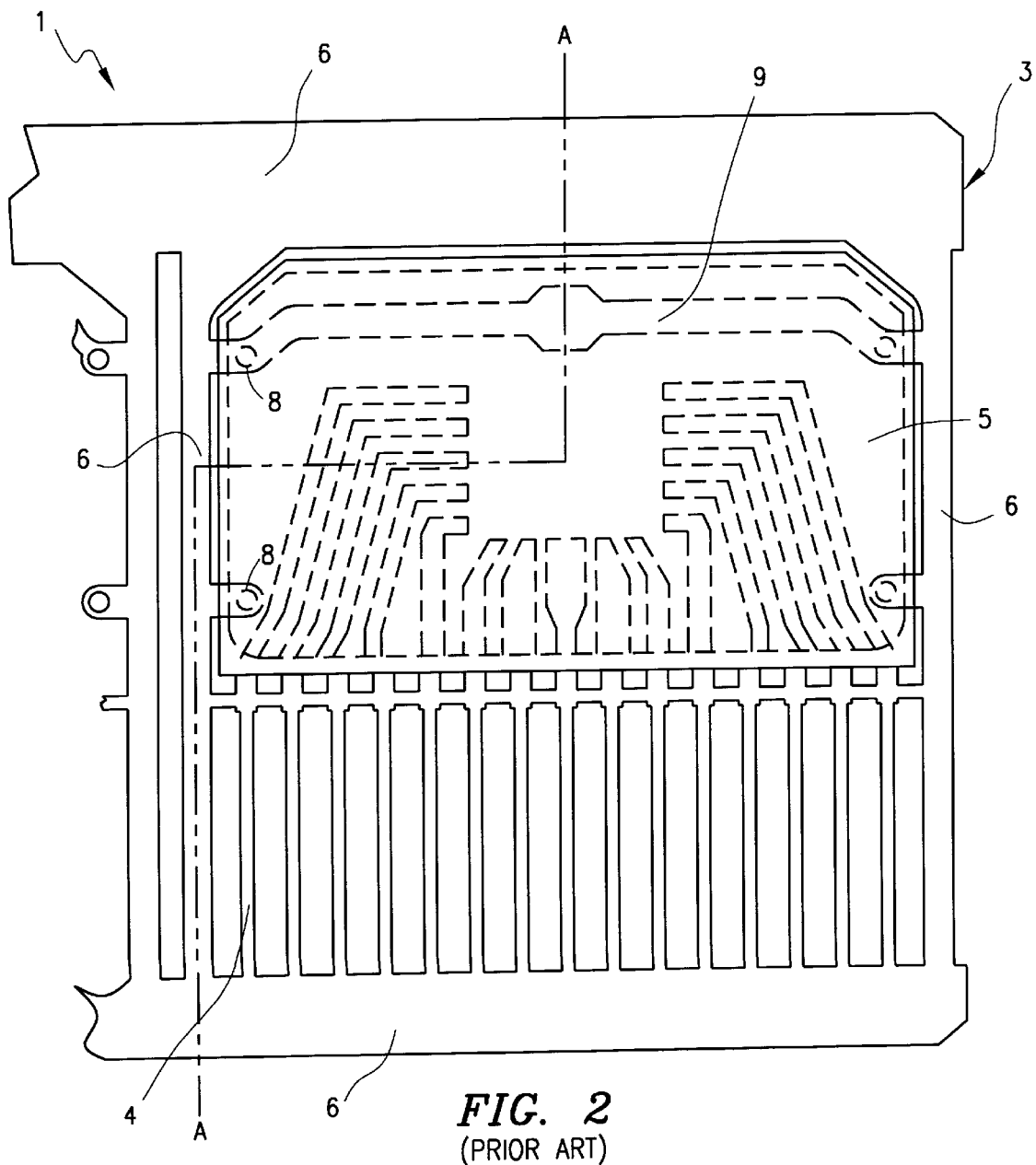
FIG. 2 is a top view of the package shown schematically in FIG. 1.
Figure 3:
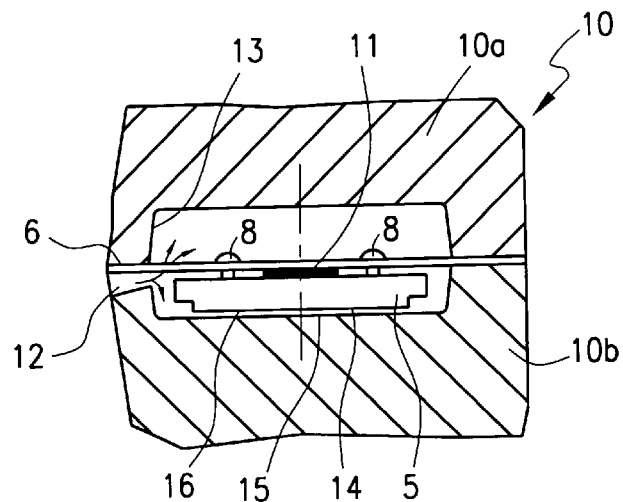
FIG. 3 illustrates a step of molding an insulated heat sink by a conventional technique, and the problems encountered with its formation.
Figure 4A:
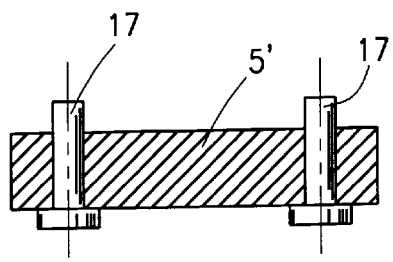
FIGS. 4a and 4b illustrate a conventional molding method using fixed clamping pins.
Figure 4B:
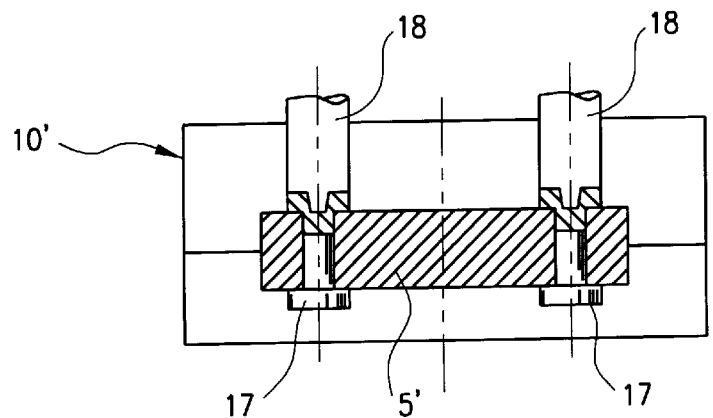
Figure 5A:
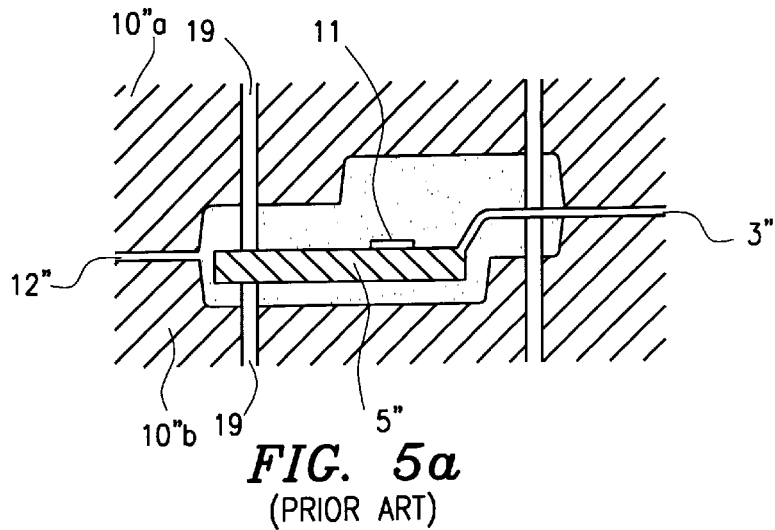
FIGS. 5a–5c illustrate schematically steps of a conventional method using retractable clamping pins.
Figure 5B:
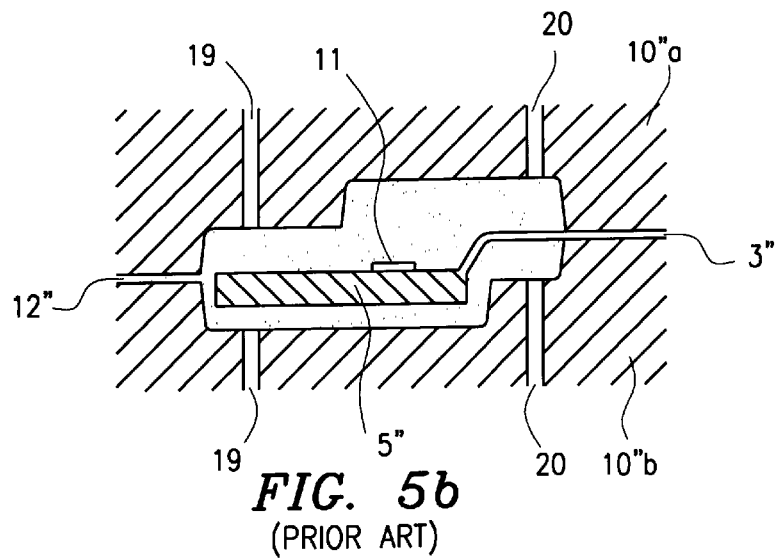
Figure 5C:
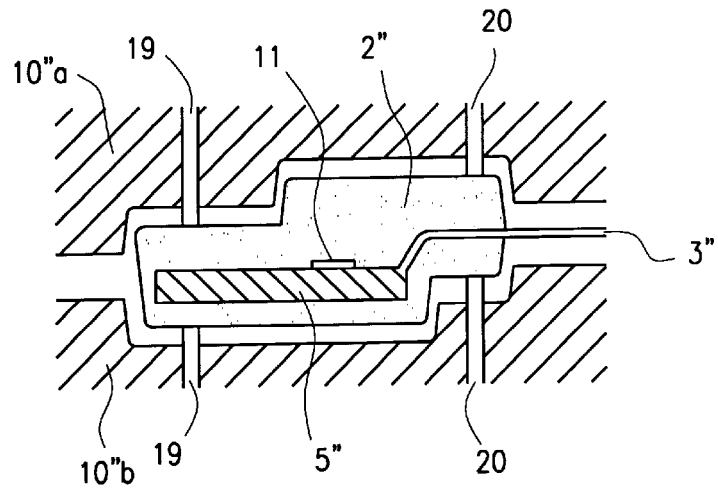
Figure 6:
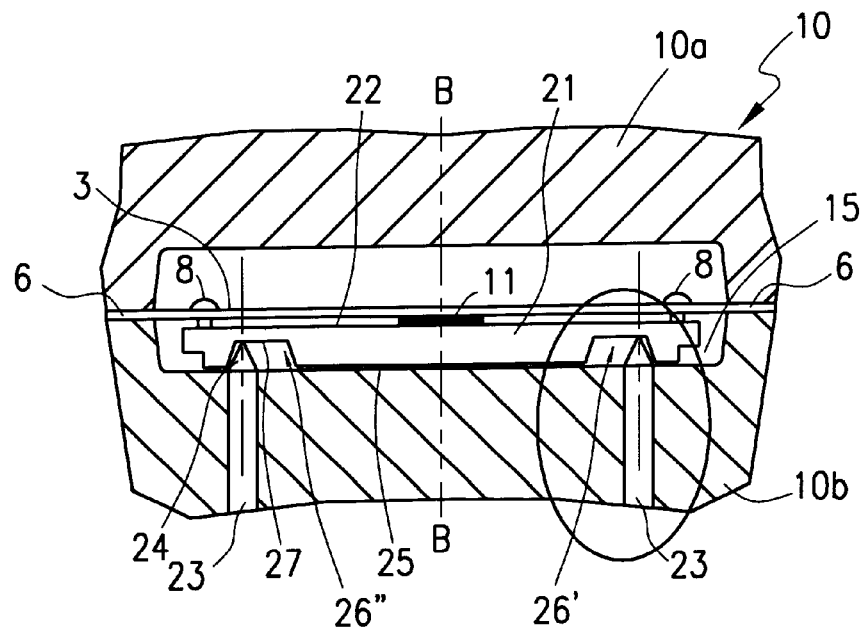
FIGS. 6 and 7 are views in longitudinal and cross section, respectively, during the step of molding a package with a fully insulated heat sink, according to one embodiment of this invention.
Figure 7:
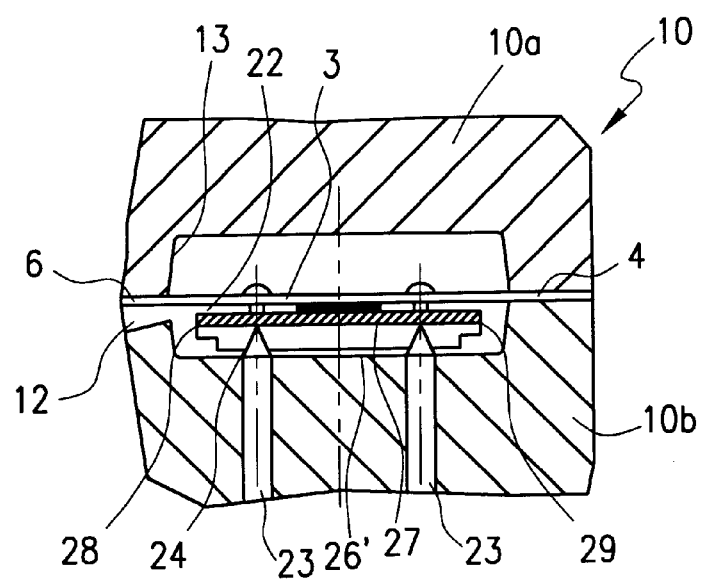
Figure 8:
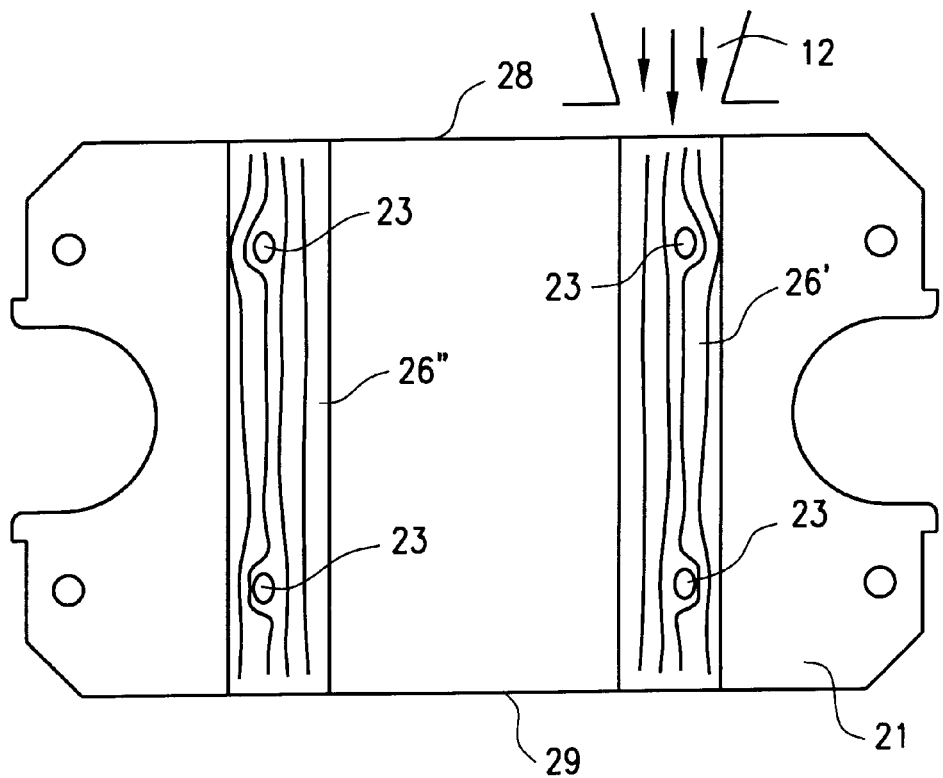
FIG. 8 is a bottom view of a heat sink formed in accordance with said embodiment.

Referring to FIGS. 6–8, there is shown an example of a method of molding a package with an insulated heat sink according to a preferred embodiment of this invention. The same reference numerals as in the previous figures have been used in these figures to denote similar elements or elements performing the same functions. The figures are drawn partly out of scale for clarity of illustration.

To illustrate the step of molding the package plastic case, the figures show a single mold cavity for forming just one package. FIGS. 6 and 7 are sectional views taken along orthogonal lines to each other, and parallel to respective sidewalls of the mold cavity.

A supporting structure with interconnection and heat dissipation functions, placed on the mold inside, includes a heat sink having a preferred structural construction in this invention. In addition, the molding apparatus is designed to suit this preferred embodiment.

The mold 10, in the example shown, comprises a pair of half molds, a top half or top mold and a bottom half or bottom mold denoted by 10a and 10b, respectively, which are disposed with their respective recesses facing each other to define a single mold cavity. The mold and mold cavity are made by a conventional technique.

In this example, a structure for a package of the single-in-line type is shown which, after the package is formed, has electric interconnection pins protruding from only one long side of the case. In other words, the leads only extend from one long side of the leadframe, as in the examples previously described.

With specific reference to FIG. 6, there is shown a longitudinal section, i.e. a section taken along a perpendicular line to the leads, of the mold cavity and the structure for interconnection, support and heat dissipation of the device.

A plastic material in a molten state, typically an epoxy resin, is injected into the cavity through a gate, not shown in this figure.

A heat sink 21, not sectioned in this view, is represented by a metal foil, e.g. of copper, substantially in the form of a parallelepipedon. It is fully enclosed within the mold cavity with its peripheral surfaces facing corresponding walls of the mold lying parallel with them.

A leadframe 3 is mounted on a first major surface, specifically the top surface 22 in the figure, of the heat sink 21 and is held raised from the latter by rivets 8.

The leadframe 3 comprises a metal strip cut by shearing from a sheet metal, usually copper, whereon the same pattern is replicated. A peripheral holder structure 6 for the leadframe 3, which allows the frames in one strip to be connected together, lies outside the cavity and is shown laterally in the cavity in the figure. Leads or electric connectors formed on the leadframe 3 jut out orthogonally, in particular entering the plane of FIG. 6, and are, therefore, concealed from view.

Fixed to the top surface 22 of the heat sink 21 is also a die 11 of a semiconductor material which has an electronic circuit formed on its surface not contacting the heat sink 21.

According to this invention, supporting elements for the heatsink/leadframe structure are mounted in the bottom mold 10b. While only two supporting elements, denoted by 23 in the figure, have been shown, in this preferred embodiment there are two more elements 23 arranged symmetrically in another plane parallel to the section plane of FIG. 6. Also, in the plane of the figure, the supporting elements 23 are arranged symmetrically about a central symmetry axis of the heat sink denoted by B—B. The provision of four symmetrical pins for a heat sink of the type shown, having substantially rectangular major surfaces, ensures optimum stability as concerns support during the molding process.

The supporting elements 23 are fixed along a vertical axis within the mold such that only terminal tips 24 will protrude into the mold cavity. The tips 24 provide support for the heat sink during the molding operation having the function of keeping spaced a second major surface of the heat sink 21, specifically the bottom surface 25 thereof, away from a corresponding wall of the cavity denoted by 15. The surface 25 is the major surface which is to be insulated by means of an insulating resin layer of thin thickness compared to that insulating the top surface.

The tips 24 of the supporting elements 23 engage with the bottom surface 25 for this reason. For the purpose, and according to the invention, the bottom surface 25 of the heat sink is formed with dedicated trenches, denoted by the reference numeral 26 (26' and 26"), having the purpose to receive the tips 24. Specifically, the tops of the tips 24 will contact the deepest wall of the corresponding trench, denoted by 27.

In the illustrated preferred embodiment, the tips 24 shown in the figure are conical in shape. This shape is particularly simple and easily formed.

The tips 24 have, in this invention, a sharp top, or virtually dimensionless. In other words, the end of the tip 24 has negligible cross-sectional area compared to the base area. Illustratively, in the preferred embodiment, the tip top is on the order of $10^{-2}$ mm, and the base is two orders of magnitude larger, approximately 1 mm.

Notice that in this invention it is essential for the tip top to be as sharp as possible. The region of contact between the tip 24 and the wall 27 inside the trench should have the smallest possible area. In that region, in fact, the heat sink surface will issue from the molding operation uncovered by the plastic material and, hence, not insulated.

This construction of the supporting tips 24 allows to minimize the risk of electric discharge liable to damage the device.

Within the leadframe 3, it should also be noted that, as shown in the figure, the trenches 26 are fairly deep. An appropriate choice of the trench depth allows the uncovered metal regions of the heat sink to be spaced as far as possible away from the bottom surface of the plastic case of the package, thereby averting electrostatics problems, as described in detail in a following figure.

In one embodiment where, for example, the heat sink 21 had a thickness of about 1.3 mm, the preferred depth of the trenches 26 was around 0.7 mm. These trenches can be produced by conventional techniques without distorting the heat sink.

As can be seen, the depth of the trenches 26 is in practice of the same order of magnitude as the height of the tips 24 of the supporting elements 23. This illustrative depth is a specially favorable one.

In the preferred embodiment, the trenches 26 have a first inlet opening, designed to foster the canalization of resin into the trench, as explained hereinafter, on a side surface of the heat sink 21. Because the heat sink 21 is not sectioned in this view, only the respective inlet openings of the trenches 26 on the foreground side surface 28 of the heat sink are visible.

As shown in FIG. 6, the width of the trench 26 is, according to the principle of this invention, substantially greater than the size of the tips 24 of the supporting elements 23, in such a way a peripheral area around each tip is left unoccupied in each trench. This will admit a flow of plastic material around the tips to cover their lateral surfaces inside the trenches. In FIG. 6, the ratio of the two dimensions ranges, illustratively and preferably, is from 2 to 5.

In addition, the tips 24 are located at off-centered positions from the main axis, shown in the Figure of the corresponding trench 26' or 26", as explained hereinafter.

FIG. 7 is a sectional view taken along a cross-line passing through a trench, specifically trench 26'. Thus, the heat sink appears in section there.

Connectors or leads 4 are formed integrally with the leadframe 3 and extend out of the mold cavity, on the right in the figure. The leads 4 are clamped, as is the peripheral structure 6 of the leadframe shown on the left in the figure, between the two mold halves 10a and 10b such that they also provide some support for the structure consisting of the heat sink 21 and the leadframe 3.

In this preferred embodiment, the trenches 26 have openings on opposite side surfaces of the heat sink 21, in particular on the surfaces corresponding to the long sides. Additionally to the first opening on the surface 28 shown in FIG. 6, a second opening is opened on the opposite surface 29 parallel thereto. The trenches have their main axes substantially orthogonal to said side surfaces 28 and 29.

The trenches 26 are grooves substantially in the form of parallelepipedons, and accordingly, of constant cross-section. This profile is preferable because it is simple to obtain.

In the preferred embodiment, into each trench 26 is accommodated a pair of symmetrically disposed tips 24 of the supporting elements.

Also shown in FIG. 7 is a gate 12 for introducing the molten resin during the molding process which opens into the mold cavity and is formed in a conventional manner. The gate 12 in the figure is illustratively formed in the bottom mold 10b, according to a conventional technique, but in a different embodiment, may be formed in the top mold 10a, or both. In either case, the gate 12 would lie with its main axis substantially horizontal.

The gate opening into the mold cavity locates in one of the large side walls, denoted by 13, facing the side surface 28 of the heat sink 21. In particular, the gate 12 is formed near one corner of the mold, or edge of the package to be formed.

According to an advantageous embodiment of this invention, one of the trenches 26, specifically trench 26' visible in the figure, has been located corresponding to the gate 12. The main axis of the trench 26' will, therefore, be substantially coincident with the axis of the gate 12 and, hence, with the main direction of the resin flow entering the mold.

Consider the behavior of the resin entering the section shown in the figure. As previously described in connection with the state of the art, the resin flow will be directed preferably toward the top surface 22 of the heat sink 21. However, the presence of the trench 26' creates a sort of drain channel which enhances the resin passage downwards. Thus, proper filling of the trench 26' is fostered by this arrangement.

Also notice that the trench 26' advantageously makes easy covering the bottom surface 25 of the heat sink 21 and, therefore, forming the thin resin layer.

To better illustrate the resin flow pattern during the injection step according to this invention, FIG. 8 shows a bottom plan view, i.e. a view from the side of the bottom surface 25 of the heat sink 21. The streamlines are marked by arrowheads.

As can be seen, the resin preferably gets into the drain channel 26' located in front of the gate 12, also thanks to the resin inflow axis and the axis of the trench 26' being substantially coincident. However, a non-straight trench would be equally advantageous if it had in any case a first main axis adjacent to the entering opening or inlet and parallel to said flow direction.

The resin flow is further facilitated by the provision of a second exiting opening or outlet formed in the opposed side surface 29 in this embodiment.

The resin will simultaneously stream orthogonal to the main flow direction to fill the remote space from the gate, the movement occurring from left to right in the figure. The second drain channel 26" forms a further flow channel of low hydrodynamic resistance so that the resin will easily fill this channel. The behavior is similar to that of the drain channel 26' filling, although the resin here will reach the inlet openings of the second trench at reduced pressure and velocity. However, pressure will rise inside the drain channel 26" ensuring proper filling.

The provision of this second drain channel 26", among others things, fosters filling of the small gap between the bottom surface 25 of the heat sink and the bottom wall 15 of the mold to form the thin insulating, layer even in the farthest region from the gate 12.

Notice that, as previously mentioned, the supporting elements 23 inside each trench 26 are arranged along an axis which is parallel to the trench axis but removed therefrom. In other words, the tips 24 of the supporting elements are disposed asymmetrically within the trenches.

This arrangement is of special advantage inside the trench 26'. In fact, the tips 24 of the supporting elements, once inserted into said trench, would not lie along the main flow axis of the resin, which as mentioned, enters the cavity under a certain pressure. On the one side, the resin will lap more easily the tips 24 from both sides, and on the other, the main resin flow will not be interrupted.

Otherwise, an axially aligned arrangement would generate an excessive resistance to the resin stream and reduce its velocity due to the establishing of a non-linear or irregular flows. This could result in improper flowing of the resin and incomplete covering of the bottom surface of the heat sink.

Notice that the trench width, relatively larger within limits than the dimensions of the supporting tips, is necessary and sufficient to enable the resin to properly and fully cover the side surfaces of the tips.

This is specially advantageous in the embodiment shown in the figures, wherein the gate 12 opening and the width of the facing trench 26' are illustratively the same order of magnitude.

Figure 9:
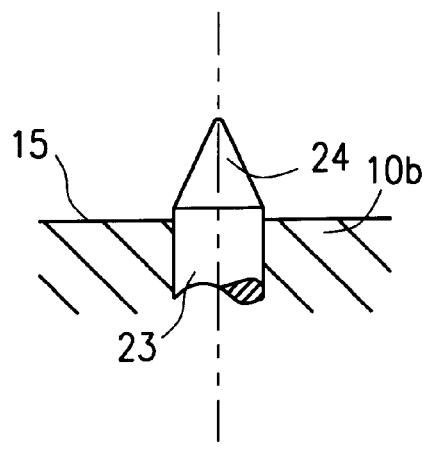
FIG. 9 shows a detail of FIGS. 6 and 7 highlighting an element for supporting the bottom surface of the heat sink, according to an embodiment of the present invention.

FIG. 9 shows in detail the positioning of the tip 24 of a supporting element inside the mold. The figure shows the region inside a circle in FIG. 6 on a larger scale. The heat sink is not shown, while the bottom mold 10b is only partially visible.

Only the tip 24 will protrude out of the mold 10 in the preferred method. In this way, the volume which will not be filled by the resin during the molding process can be minimized to ensure maximum coverage of the device by the insulating resin.

On the other hand, if the tip 24 were partly recessed within the mold, resin would infiltrate under the level of the wall 15 and result in the formation of resin flash on the bottom surface of the plastic case. To avoid this, the base of the tip 24 is kept substantially at the level of the inner surface of the cavity.

In practice, as clearly shown in the figure, the base of the tip 24 is indeed positioned slightly above the wall 15. The amount of this difference in height is selected to take account of misalignment tolerances due to possible deformations of the molding apparatus. Thus, this arrangement will prevent irregularities in the outer surface of the plastic case.

Figure 10:
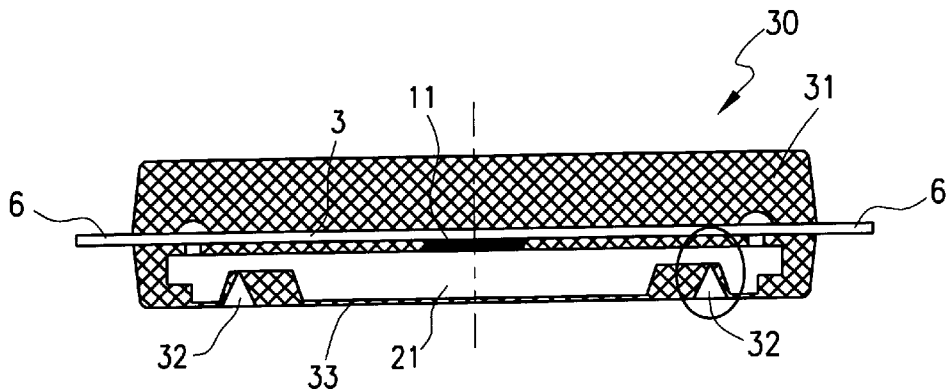
FIG. 10 is a longitudinal section through a plastic package formed with the method illustrated in the previous figures, according to an embodiment of the present invention.

A package formed by a method according to the invention is shown in FIG. 10. The package, as after the molding process, is generally denoted by 30 and is shown in vertical cross-section through a long side thereof.

The formed plastic case is shown at 31 in sectional view. Inside the case 31, the heat sink 21 embodying this invention is fully embedded in the resin. Also shown in the figure are the leadframe 3 and die 11, being both fixed to the top surface 22 of the heat sink 21. At this stage, the peripheral portion 6 of the leadframe outside the case 31 is still connecting together packages in the same strip.

According to the invention, the case 31 has hollows, i.e. volumes not occupied by the resin, denoted by 32, in the bottom surface 33. The section shown in the figure passes through hollows placed all along the same line orthogonal to the device pins, not shown.

Two hollows 32 are located connected with the trenches 26 in the bottom surface 25 of the heat sink. In fact, they represent in particular volumes occupied by the tips 24 of the supporting elements which will remain fixed inside the mold cavity during the molding process.

Each hollow 32 has on its bottom surface 33 a mouth area which corresponds to the base area of the tip 24 of its respective supporting element. Its cross section gradually tapers, reacting down to the heat sink surface, in a portion of the wall 27 of the corresponding trench 26. In this embodiment, the hollows 32 have specifically a conical shape mating with that of the tips.

Figure 11:
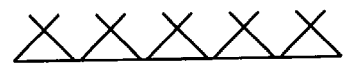
FIG. 11 is a detail view of a hollow dug in the plastic case of the package, according to an embodiment of the present invention.
Figure 11:
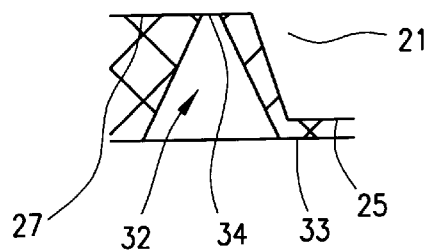

FIG. 11 is a second enlarged view of the region drawn to attention in FIG. 10 showing a single hollow 32, not drawn to scale for clarity.

As can be clearly seen, the bottom surface of the heat sink 21 is only exposed, that is uncovered by the resin for its insulation and protection, at the portion 34 on the deepest wall 27 of the trench 26. This exposed region 34 represents the region occupied by the top of the support tip. The portion 34 is, therefore, significantly smaller than the inlet dimensions of the hollow 32, although its size has been exaggerated in the figure.

Notice that, according to the invention, the distance between such exposed metal portions 34 and the bottom surface 33 of the plastic case is of the same order of magnitude as the thickness of the heat sink 21. In the most commonly occurring applications, such as the previously mentioned audio applications to which the invention is related, and therefore, for the specific voltages used and tolerated by the device, this distance is included in international safety standards. In the previously described embodiment, said distance would be 0.95 mm. International insulation standards, for apparatus operated at relatively low voltages, set for this distance a maximum r.m.s. (root mean square) of 200 V, much higher than the voltages to be found in standard applications.

The distance of the tiny uncovered areas 34 from the bottom surface 33 of the case 31 is the combined outcome of the depth of the trench 26 in the point where the top of the support tip 24 engages and of the thickness of the thin layer, denoted by 35, formed over the bottom surface 25 of the heat sink.

In general, the choice of the minimum depth for the trenches formed in the heat sink will depend in this invention on the specific application and, hence, the operating voltage of the electric circuit enclosed within the plastic case.

The preferred depth is a compromise between this requirement and the provision of good flow conditions for the resin, on the one side, and the need for the heat sink to undergo no deformation within the limits of the characteristics of the material from which it is formed and of its configuration, on the other.

Figure 12:
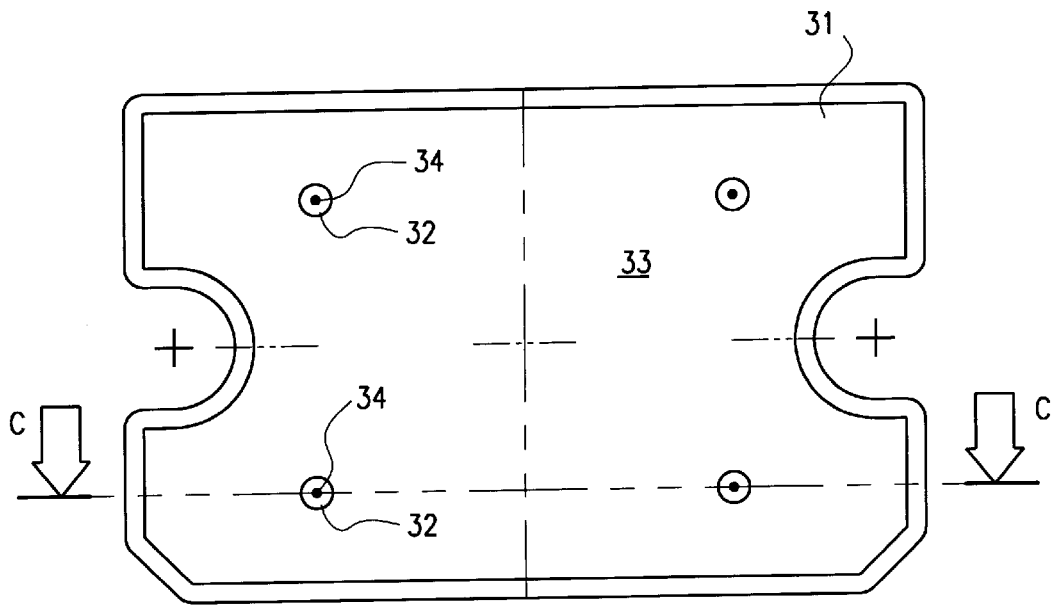
FIG. 12 is a bottom view of the plastic case alone, according to an embodiment of the present invention.

FIG. 12 is a plane view of the bottom surface of the plastic case for a package made with the method described above and of which FIG. 10 is a section taken along line C—C. Only the case 31 is shown in the figure, while have been omitted the leads and outer peripheral structure of the leadframe.

The case 31 outline, showing semicircular recesses in the central portion of the short side surfaces to accommodate screws for fastening the device to the external heat sink or the printed circuit board, is merely preferred and conventional, immaterial for the purpose of this invention.

According to the present invention, in the surface 33 are formed four hollows 32. As shown, the hollows have circular inlet areas. The near-punctual portion 34 at the hollow center represents the exposed surface of the heat sink 21 and lies in a parallel plane to the drawing sheet, but behind it.

Notice that, due to deformations to the metal structure or imprecise horizontal alignments, some of the tips 24 of the supporting elements may not be perfectly in contact with the wall 27 on the bottom of the respective trench. Adding to this, the fact that the tip top has a limited contact area, it may happen that the resin also manages to cover the tip top in such cases. Accordingly, the heat sink surface would automatically be insulated at some portions 34, thereby improving the electric insulation of the device.

The molding apparatus used in the method of this invention is quite versatile. For example, each supporting element may be suitably pulled out of the mold and replaced with another element having a tip with different dimensions or shape, or a plug can be similarly inserted in its place. In this way, the number of the supporting elements can be varied to suit a specific application, and where all the elements are removed, the same mold can be adapted for molding power packages with non-insulated heat sinks.

It should be understood that, while the invention has been particularly described in relation to a package of the single-in-line type, it would be possible alternatively to apply it to packages having pins protruding from two opposite sides of the case. Such structures are referred to as packages of the dual-in-line type or DIPs. In this case, the resin injection gate would be arranged to be facing an side orthogonal to those containing the pins, and the trenches formed in the heat sink could have for example their axis parallel to its long sides.

In the preferred embodiment described above, the trenches have an outlet on a side surface which lies opposite from the surface wherein is formed the inlet. However, the same function could be served by an outlet formed on a different surface, such as an orthogonal side, that is one of the small side surfaces, with the trench being crank-shaped. The inlet opening may open to the same surface containing the other outlet opening (V-shaped trench).

It is preferable that at least the initial trench section next to the first inlet has an axis parallel to the main axis of the resin flow, so as to duct the flow and foster proper filling of said trench portion. Successive trench portions could have their axes along different directions, as in the two instances cited of the crank- and V-shaped trenches.

In one embodiment, the trenches could be interconnected to have a common outlet for the resin reflow.

Furthermore, while in the example described the two trenches are formed symmetrically around a central symmetry axis of the heat sink, it is above all important that these be formed on opposite sides comparing to said axis. The relative positions and shapes of the trenches may vary according to the symmetrical character of the heat sink around said axis.

Although it has been assumed thus far that the trenches are grooves with substantially constant depth and width, the invention could be validly embodied by trenches equal in number to the supporting elements. Each of them would accommodate one tip and be preferably of homologue shape, e.g. circular, with the tip cross-section, but larger to allow the resin to flow past. Preferably, two or more of these trench portions can be joined by grooves of reduced depth and width to allow the resin to pass from one groove to another.

Also the shape of the tips may be other than that shown and described, and yet within the scope of this invention. Specifically, the tip bases may be of any shape, including non-circular shapes; for example, the tips may be pyramid-shaped with a polygonal base. It is only essential that their tops be made suitably sharp.

In addition, where the resin gate is a broad one compared to the width of the trench facing it, or the trench width is definitely larger than the gate, it is unnecessary to have the supporting elements placed along a separate axis from the main inlet axis of the plastic material.

Notice that to provide adequate support for the heat sink during the molding process, three supporting elements are sufficient for a package configured as in the previous example.

The method of this invention may also be applied to devices wherein one of the leads is formed integrally with the heat sink and, accordingly, also functions as a device electrode or terminal, whereas in the application referred to illustratively, the leads are all formed on the leadframe. In the former case, as said before, the lead provides support for the heat sink from one side in the mold. In this case, stability can be ensured by just one or two supporting elements.

In general, the number of the supporting elements, and hence the shape and layout of the respective trenches formed in the heat sink, will vary with the leadframe/heat sink structure.

Also, in a different technique, the mold could be made other than in two mold halves arranged as previously explained.

While this method has been described with reference to a single semiconductor die soldered to the heat sink, the method can also be applied if several dies are placed on the heat sink.

It is understood that modifications and changes may be made to this method of forming a plastic package with a fully insulated heat sink, without departing from the true scope of the invention as defined in the following claims.

What is claimed is:

1. A method for forming a package of plastic material for a semiconductor electronic device, said method comprising the steps of:
    providing a heat sink having a first surface and a second surface, said second surface including a first trench defined therein, said trench extending substantially from a first edge of said second surface to a second edge thereof opposite said first edge;
    attaching an integrated circuit die to said first surface of said heat sink;
    securing a lead frame to said first surface of said heat sink, said heat sink, said integrated circuit die and said lead frame forming a semiconductor die assembly;
    positioning said semiconductor die assembly within a package mold, said package mold including a gate opening for introducing flowable plastic material within the mold and at least one stationary supporting element positioned along a first inner wall of the mold and having a tip extending into the mold cavity, said stationary supporting element being positioned within said first trench of said heat sink for spacing the second surface of the heat sink from said first inner wall of the mold, a longitudinal axis of said first trench being positioned in a first direction within said mold;
    introducing flowable plastic material into the mold cavity via said gate opening such that a primary direction of flow of said flowable plastic material within the mold cavity is said first direction; and
    allowing said flowable plastic material to substantially solidify to form a plastic case around said semiconductor die assembly.

2. The method according to claim 1, wherein the depth of said first trench is of the same order of magnitude as the height of said tip of the supporting element.

3. The method according to claim 1, wherein said first trench has an inlet opening on a first side surface of the heat sink; and
    said inlet opening which, during said positioning step, will be adjacent said gate opening.

4. A method according to claim 3, wherein said trench has a main axis lying parallel to the inflow direction of the plastic material from the gate into the mold cavity.

5. The method according to claim 3, wherein said first trench has another opening on a second side surface.

6. A method according to claim 5, wherein said second side surface is opposite from said first side surface.

7. A method according to claim 3, wherein said inlet opening is located corresponding to said gate.

8. The method according to claim 3, wherein said supporting element, when positioned in said first trench during said introducing step, is offset from the main axis of flow of said flowable plastic material through the gate opening.

9. The method according to claim 1, wherein a second trench is defined along said second surface of said heat sink and symmetrically spaced relative to said first trench therealong.

10. The method according to claim 9, wherein the depth of said first and second trenches is substantially uniform.

11. The method according to claim 1, wherein the base of said tip of the supporting element is raised off said first inner wall of the mold.

12. The method of claim 3, wherein:
    the mold includes a plurality of stationary supporting elements extending from said first inner wall of the mold, each said stationary supporting element being disposed within said first trench during said positioning and said introducing steps; and
    an axis formed by said stationary supporting elements is offset from a main axis of flow of said flowable plastic material through said gate opening during said introducing step.

13. The method of claim 1, wherein:
    the mold includes a plurality of stationary supporting elements extending from said first inner wall of the mold; and
    said semiconductor die assembly rests on said stationary supporting elements in an unclamped engagement therewith during said introducing step.

14. A method of packaging an integrated circuit, comprising the steps of:
    attaching the integrated circuit to a first surface of a heat sink, a second surface of the heat sink having a trench defined from a first edge of the second surface to a second edge thereof;

attaching a leadframe to the heat sink, the integrated circuit, heat sink and leadframe forming a circuit assembly;

positioning the circuit assembly within a mold, the mold including an inlet for introducing flowable material into the mold, a second surface of the heat sink is spaced from a first inner surface of the mold and an end of the trench is adjacent the mold inlet, the circuit assembly being unclamped within the mold;

introducing flowable material into the mold inlet so that the leadframe, the integrated circuit, and the heat sink are substantially embedded within the flowable material; and allowing the flowable material to solidify.

15. The method of claim 14, wherein:

the mold includes a plurality of support members which extend from the first inner surface of the mold, each support member having a tapered tip;

the support members are in a fixed position relative to the mold during the positioning step, the introducing step and the allowing step; and the tips of the support members are positioned within the heat sink trench so that the circuit assembly rests on the support members during the positioning step, the introducing step and the allowing step.

16. The method of claim 15, wherein:

the longitudinal axis of the trench is substantially axially aligned with a primary axis of the mold inlet during the introducing step;

the width of the trench is substantially the same as the width of the mold inlet; and the tips of the support members are offset from the longitudinal axis of the trench during the introducing step.

17. The method of claim 15, wherein:

the depth of the trench is substantially the same as the height of the support member tips.

18. The method of claim 15, wherein:

the heat sink includes two trenches defined along the second surface thereof;

the tips of the support members are positioned within the heat sink trenches so that the circuit assembly rests on the support members during the positioning step, the introducing step and the allowing step.

19. The method of claim 15, wherein:

the tip of each support member is spaced from the first inner surface of the mold during the positioning step, the introducing step and the allowing step.

20. A method of packaging an integrated circuit, comprising the steps of:

attaching the integrated circuit to a first surface of a heat sink, a second surface of the heat sink having a trench defined from a first edge of the second surface to a second edge thereof;

attaching a leadframe to the heat sink, the integrated circuit, heat sink and leadframe forming a circuit assembly;

positioning the circuit assembly within a mold so that the second surface of the heat sink is spaced from a first inner surface of the mold, the circuit assembly being unclamped within the mold;

introducing flowable material into the mold so that the leadframe, the integrated circuit, and the heat sink are substantially embedded within the flowable material within the mold, the heat sink trench being aligned with the primary axis of flow of the flowable material; and allowing the flowable material to solidify.

21. The method of 20, wherein:

the mold includes a plurality of support members which extend from the first inner surface of the mold, each support member having a tapered tip;

the support members are in a fixed position relative to the mold during the positioning step, the introducing step and the allowing step; and the tips of the support members are positioned within the heat sink trench so that the circuit assembly rests on the support members during the positioning step, the introducing step and the allowing step.

22. The method of claim 20, wherein:

the mold includes an inlet through which the flowable material flow during the introducing step; and the heat sink trench is adjacent the mold inlet during the introducing step.

23. The method of claim 22, wherein:

the width of the trench is substantially the same as the width of the mold inlet; and the tips of the support members are offset from the longitudinal axis of the trench.

* * * * *